United States Patent [19]
Hubert et al.

[11] 3,949,205
[45] Apr. 6, 1976

[54] AUTOMATIC ADDRESS PROGRESSION SUPERVISING DEVICE

[75] Inventors: Maurice Hubert, Versailles; Jean-Louis Fressineau, Les Clayes-sous-Bois, both of France

[73] Assignee: Compagnie Internationale pour l'Informatique, Louveciennes, France

[22] Filed: Nov. 20, 1974

[21] Appl. No.: 525,519

[30] Foreign Application Priority Data
Dec. 4, 1973 France .............................. 73.43134

[52] U.S. Cl. ......................................... 235/153 AM
[51] Int. Cl.² ......................................... G06F 11/00
[58] Field of Search .............. 235/153 AM, 153 AP; 340/172.5

[56] References Cited
UNITED STATES PATENTS

| | | | |
|---|---|---|---|
| 3,231,858 | 1/1966 | Tuomenoksa et al. | 235/153 AM |
| 3,283,307 | 11/1966 | Vigilante | 235/153 AM |
| 3,585,378 | 6/1971 | Bouricius | 235/153 AM |
| 3,599,146 | 9/1971 | Weisbecker | 235/153 AM |
| 3,732,407 | 5/1973 | Brewster et al. | 235/153 AP |
| 3,794,818 | 2/1974 | Kennedy | 235/153 AM |
| 3,794,821 | 2/1974 | Hodges et al. | 235/153 AM |
| 3,806,716 | 4/1974 | Lahti et al. | 235/153 AM |
| 3,814,921 | 6/1974 | Nibby et al. | 235/153 AM |

*Primary Examiner*—Charles E. Atkinson
*Attorney, Agent, or Firm*—Kemon, Palmer & Estabrook

[57] ABSTRACT

A supervising device is described for detecting errors in an automatic progression of the addresses of words which must be sequentially read out from a store under the control of a command logic forming the starting address from an operation code and thereafter incrementing the address by combining a portion of each read-out word with other data. Said device comprises a code comparator the output of which is activated when a code of a restricted number of bits derived from the operation code and a code of the same number of bits derived from a read out word disagree except when this second code presents a particular configuration of bits as, for instance an all identical binary value bit configuration.

8 Claims, 2 Drawing Figures

AUTOMATIC ADDRESS PROGRESSION SUPERVISING DEVICE

BRIEF SUMMARY OF THE INVENTION

The present invention concerns improvements in or relating to automatic address progression supervising devices for information processing units of the kind wherein read-out store addresses are generated by a command logic cooperating with the said store, which in most cases, is of the read-only kind. In such units, as known, the command logic generates the first read-out address of a series by processing an operation code supplied thereto and which defines the sequence of the words to be read-out from the store. Theafter, and upon each read-out, said command logic computes the address of the next word to read-out by combining a part of the read-out word with other program-defined data. During execution of the said read-out sequence, the operation code remains memorized in a status register of the command logic.

During execution of such a read-out sequence, it is possible that errors appear in the generation of the store addresses in the progression. Such errors are most often due to a faulty operation of the command logic and each time such an error occurs, a wrong word is read-out from the store; In most cases, the sequence of words read from the store together constitute a definite micro-programme for use in another part of the information processing system of which the unit is a component, so that no early detection of failure of the unit can be detected in said another part of the system.

The present invention provides an automatic address progression supervizing device which enables an early detection of errors in the addressing of a store.

The invention is mainly based on the remark that each word which in the store relates to a micropro-gram, or another sequence of words, already includes a part which is characteristic of the sequence or microprogram to which it is an item. However some words are so-called banalised words, i.e. they are not items of any predetermined sequences or microprograms though they may be called for during execution of such a read-out sequence. None of such banalized words will present any part which is characteristic of a defined microprogram or sequence.

According to the invention, a supervising device comprises the combination of first means deriving from the memorized operation code a further code having a definite and smaller number of bits, second means deriving from any read-out word a code of the same number of bits as said further code, comparator means for the derived codes for outputting a signal when said codes disagree, and means inhibiting the output of such a disagree signal for at least one particular configuration of the code derived from said second means.

It must be noted that the derived codes are not imperatively of the same bit configuration to be accepted as agreeing by the comparator since, as known, a code comparator may operate to agree on two codes presenting predetermined distinctive bit configurations. It must also be noted that the output of a comparator may be inhibited either by disabling its operation proper or by masking its output.

BRIEF DESCRIPTION OF THE DRAWINGS

The invention will be described in full detail with reference to the accompanying drawings, wherein.

DETAILED DESCRIPTION

Figure 1:
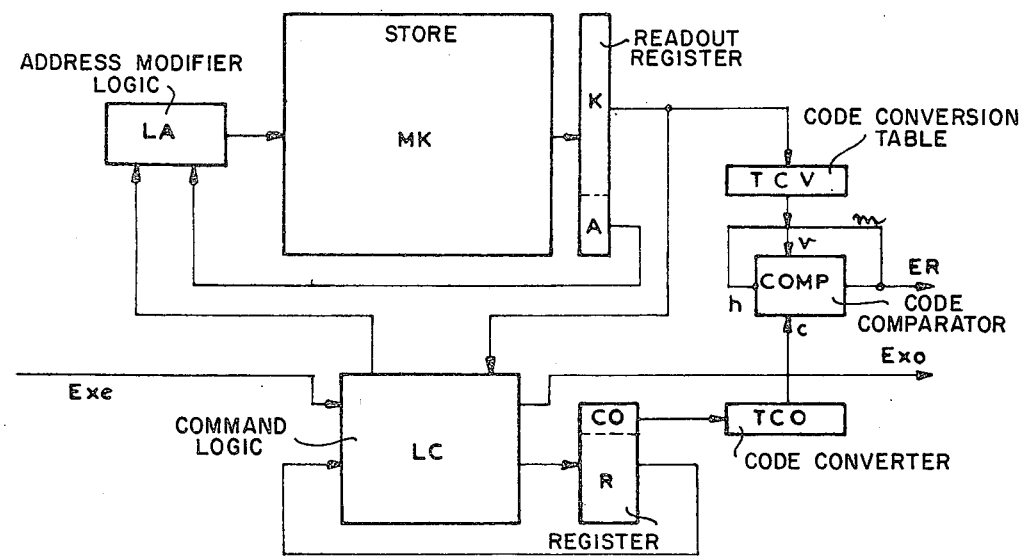
FIG. 1 is a block diagram of a first embodiment of the device.
Figure 2:
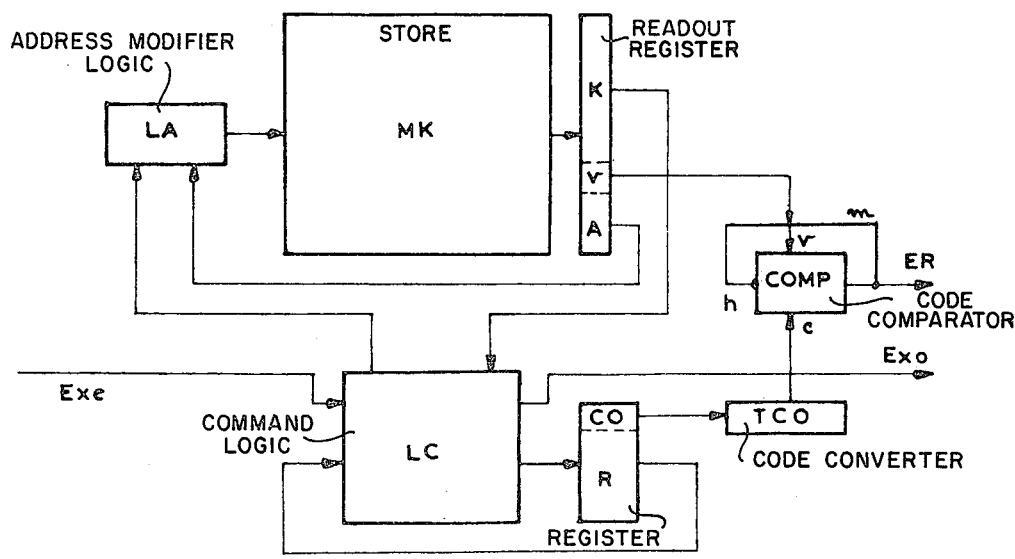
FIG. 2 is a block diagram of a second embodiment.

In both FIGS. 1 and 2 is shown a store MK which may consist of a multiple microprogram instruction store also memorizing a number of banalized microinstruction words. In the read-out register of the store, each word will comprises a portion K and a portion A and this K portion is connected to an input of a command logic LC whereas the A portion will be routed to an address modifier logic LA another input of which is connected to an output of the command logic LC. Actually, it must be understood that LA is a part of LC which is separately shown for the sake of clarity. Also separately shown from LC is a register R which is actually a status register of LC and which memorizes in its part CO an operation code of a task executed by the unit comprised of the just described components. The register R closes a loop around the command logic LC which has a data input Exe and a data output Exo. The data inputting at Exe will include activation instructions together with such data as the operation code CO and, for instance, a code defining the number of words to read-out from the store during a sequence of read-out operation and consequently a sequence of progression of the read-out addresses for the store MK. The part R of the status register may for instance memorize the said number and this memorization will be decreased by one unit each time the command logic generates a new read-out address for the store.

Such a combination of components comprising such a unit is well known per se and not a part of the invention proper.

According to the invention, an address progression supervising device is associated with the above described components as follows:

A code converter TCO, which will usually consist of a mere code conversion table, is connected to an output of the operation code memorizing part CO of the status register R. The conversion table TCO will issue a code $c$ having a reduced number of bits with respect to the number of bits in the operation code CO while remaining, however, descriptive of the nature of operation which the unit must perform, i.e. descriptive or characteristic of the sequence of words which must be read-out from MK with or without intervening banalized words. The output of TCO is applied to a first input $c$ of a code comparator circuit COMP. The code issuing from TCO may be said to be a "key".

On the other input $v$ of the comparator circuit COMP is applied at each read-out from the store, a code of the same number of bits as the "key" code. Such a code $v$ may be said to be a "latch". When the codes $c$ and $v$ disagree, the comparator circuit COMP will have its output ER activated as the code $v$ will be erroneous and consequently the address progression process will be in error.

Said code $v$ may be generated either by a further conversion table TCV reading out an appropriate part of the content of the portion K of the read-out register of the store, FIG. 1, or it may be merely read from that part of the register as shown in FIG. 2.

In the case of FIG. 2, the code *v* is shown as a part of the basic address part A of the read-out word which will be used by the command logic LC, as usual, for generating the next address for the store MK. In both cases, with a conversion step in FIG. 1 or without such a conversion step in FIG. 2, the code *v* has the same number of bits as the code *c* and, except for the banalized words of the store, will be descriptive of the nature of the operation which has been defined by the operation code CO. Actually it must be understood that the number of bits of the *v* and *c* codes is determined by the number of sequence sectors of the store MK, though, obviously, such number cannot be imposed on the operation codes, and the said operation code cannot be plainly written in the words of the store as it would unduly increase the number of bits in the words. A further reason to provide a conversion table for at least the operation code is that the code *v* may be used for several microprograms stored at MK when the overall microprograming of the system enables such a use of *v* without the risk of confusion between two microprograms in MK. It is quite clear that a single bit configuration can be obtained at the output of a conversion table for several bit configurations of its input.

It would be of course possible to complicate the conversion table TCV of FIG. 1 so that the code *v* will always be present and does not give a disagree signal at the output of the comparator when a read-out word is a banalized one. It is, however, simpler in accordance with the invention so to conform the conversion table TCV or the bit configuration of *v* within any banalized word so as to obtain a single or unique bit configuration of bits of a *v* code when the read-out word is a banalised one. Such banalized words are for instance words of subroutines which may be called for in the execution of any specialied routine of microinstructions. A preferred configuration of bits of a *v* code in or from such banalized words is an all zeroes code or an all ones code which, from the circuitry point of view are full equivalent codes as, as known, the "*o*" and "1" values are purely conventional at any level of a binary information handling circuit.

Such a particular *v* code must not result in an activation of the output of the comparator. An all zeroes or all ones code can be easily converted into a signal by a multiple input AND or NAND gate and the output of the gate applied to either an inhibiting input *h* which blocks the operation of the comparator circuit or to a control output terminal *m* which makes the output condition of the said comparator true.

What is claimed is:

1. An automatic address progression memory system comprising in combination:
   a store;
   a read-out register for said store;
   an automatic address modifier logic for said store, having an input connected to an output of the said read-out register and a further control input;
   a command logic having an output connected to the said further input for application thereto of a sequence of commands;
   a register in the said command logic for memorizing an operation code defining the sequence of words to be read out from the store and correspondingly controlling the said sequence of commands in the said command logic;
   first means connected to an output of the said operation code register and deriving therefrom a further code equally significant of the said sequence of words but of a lesser number of bits with respect to the operation code;
   second means connected to an output of said read-out register and deriving therefrom a code of the same number of bits as said further code and significant of the sequence of words of which the read-out word is an item;
   means comparing the codes from said first and second means and outputting an error signal when said codes disagree;
   decoder means responsive to at least one particular bit configuration in the code derived by the said second means; and
   means controlled by the output of the said decoder means to prevent the outputting of a disagree signal by said code comparing means.

2. A device for detecting errors in an automatic address progression memory system for a store having a readout register and controlled from a logic command including an operation code register defining a sequence of words to be read-out from a first address by the said automatic address progression memory system, comprising in combination:
   first means deriving from the operation code a further code significant of this sequence of words;
   second means deriving from any word in the said read-out register a code significant of the sequence of words to which the read-out word pertains;
   code comparing means having inputs connected to respective outputs of the said first and second code receiving means,
   said code comparing means having signal preventing delivery input; and
   decoder means of the code outputting said second means, responsive to a particular configuration of bits in the said outputting code and having an output connected to said signal delivery preventing input of the code comparing means.

3. Device according to claim 2 wherein said decoder means is responsive to a code configuration having all bits of the same binary value and comprising an AND-circuit operating on all the bits of the code output of said second means.

4. Device according to claim 2, wherein said signal delivery preventing input is an inhibiting input of said code comparing means.

5. Device according to claim 2, wherein said signal delivery preventing input is an inhibiting (masking) input of the output of the said code comparing means.

6. Device according to claim 2, wherein said second means consists of output connections retrieving said code from the read-out register.

7. Device according to claim 2, wherein said second means consists of a code conversion table inserted between bit outputs of the said read-out register, and bit inputs of the said code comparing means.

8. Device according to claim 2, wherein said first means consists of a code conversion table inserted between bit outputs of the said operation code register and bit inputs of the said code comparing means.

* * * * *